United States Patent
Zinn et al.

(10) Patent No.: US 9,686,619 B2
(45) Date of Patent: Jun. 20, 2017

(54) MEMS DEVICE WITH ACOUSTIC LEAK CONTROL FEATURES

(71) Applicants: Akustica, Inc., Pittsburgh, PA (US); Robert Bosch GmbH, Stuttgart (DE)

(72) Inventors: John Zinn, Canonsburg, PA (US); Andrew Doller, Sharpsburg, PA (US); Thomas Buck, Tamm (DE)

(73) Assignees: Akustica, Inc., Pittsburgh, PA (US); Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/851,291

(22) Filed: Sep. 11, 2015

(65) Prior Publication Data
US 2016/0080871 A1    Mar. 17, 2016

Related U.S. Application Data

(60) Provisional application No. 62/050,037, filed on Sep. 12, 2014.

(51) Int. Cl.
*H04R 25/00* (2006.01)
*H04R 19/04* (2006.01)
(Continued)

(52) U.S. Cl.
CPC .......... *H04R 19/04* (2013.01); *B81B 7/0061* (2013.01); *B81C 1/00309* (2013.01); *B81B 2201/0257* (2013.01); *H04R 2201/003* (2013.01)

(58) Field of Classification Search
CPC .......... B81B 7/0054; B81B 2201/0257; B81C 1/00666; H04R 19/00; H04R 19/04;
(Continued)

(56) References Cited

U.S. PATENT DOCUMENTS

2006/0006483 A1    1/2006  Lee et al.
2013/0221457 A1    8/2013  Conti et al.
(Continued)

FOREIGN PATENT DOCUMENTS

JP    2007124449 A    5/2007

OTHER PUBLICATIONS

International Search Report and Written Opinion corresponding to PCT Application No. PCT/US2015/049669, mailed Dec. 23, 2015 (11 pages).

*Primary Examiner* — Brian Ensey
(74) *Attorney, Agent, or Firm* — Maginot Moore & Beck LLP

(57) ABSTRACT

A microelectromechanical system (MEMS) microphone in one embodiment includes a backplate, a back cavity aligned with the backplate, at least one post extending from the backplate toward the back cavity, a membrane positioned between the backplate and the back cavity and including an inner portion and an outer portion, a gap defined by a planar portion of the inner portion and the backplate, a spring arm defined in the outer portion and supported by the at least one post, a first leak path between the back cavity and the gap defined between the inner portion and the spring arm, a second leak path between the back cavity and the gap defined between the spring arm and the back cavity, and a first leak path constriction configured to restrict leakage through at least one of the first leak path and the second leak path.

20 Claims, 3 Drawing Sheets

(51) Int. Cl.
*B81C 1/00* (2006.01)
*B81B 7/00* (2006.01)

(58) Field of Classification Search
CPC .. H04R 19/005; H04R 19/016; H04R 23/006; H04R 25/00
USPC .......................... 257/416, 419; 381/174, 175
See application file for complete search history.

(56) References Cited

U.S. PATENT DOCUMENTS

| | | | |
|---|---|---|---|
| 2013/0243234 A1* | 9/2013 | Zoellin | H04R 19/04 381/369 |
| 2014/0084396 A1 | 3/2014 | Jenkins et al. | |
| 2014/0126762 A1* | 5/2014 | Zoellin | H04R 19/005 381/355 |

* cited by examiner

MEMS DEVICE WITH ACOUSTIC LEAK CONTROL FEATURES

This application claims priority to U.S. Provisional Application Ser. No. 62/050,037 filed Sep. 12, 2014, the disclosure of which is hereby incorporated herein by reference in its entirety.

FIELD

This relates to microelectromechanical systems (MEMS) devices, and more particularly to acoustic leak control methods for a MEMS device.

BACKGROUND

MEMS Microphones are pressure sensitive sensors which must be sensitive to short term small acoustic pressure fluctuations of 1/1000 Pa or even less while remaining insensitive to gradual ambient atmospheric pressure fluctuations. To make a microphone device insensitive to gradual atmospheric pressure fluctuations, a back volume of air which is equilibrated to atmospheric pressure is used on one side of the sensing structure opposite the acoustic port sound inlet. In order to equilibrate the back volume of air to atmospheric pressure, an acoustic leak path is needed to allow air to move between the acoustic inlet and the back volume. This acoustic leak path is normally integrated into the microphone structure around the perimeter of the membrane or through perforations in the membrane.

By way of example, FIG. 1 depicts a portion of a prior art MEMS device 10 which in one embodiment is a microphone. The MEMS microphone 10 includes a membrane 12 which is supported from a backplate 14 by a series of posts 16. Acoustic leak path 18 is provided from a back cavity 20 through slits 22 while acoustic leak path 24 is provided around the perimeter of the membrane 12. The backplate 14 is supported by a substrate 26 through an oxide connecting layer 28.

The presence of the back volume and acoustic leak path creates a high-pass filter which rolls off the microphone sensitivity at low frequencies. This filter is characterized by the corner frequency at which the sensitivity is reduced 3 decibels below the pass-band sensitivity at 1 kHz. This high-pass corner frequency is a key microphone performance parameter which must be maintained and which impacts other microphone performance metrics. For various microphone products, the size of the microphone back volume may change or the corner frequency specification may change, either of which may require an adjustment to the flow resistance of the acoustic leak path to achieve the desired product performance. The current state of the art is to change the size of perforations in the membrane to control the acoustic leak resistance.

The acoustic leak resistance is thus defined by parameters such as the diameter of holes within the membrane, the width and length of slits in the membrane, the gap thickness of air separating the membrane and backplate, and the distance from the membrane edge to the closest perforation in the backplate. One method of precisely controlling the acoustic leak resistance is by using an otherwise sealed membrane having a fully clamped edge combined with one or more precisely defined perforations. The sealed membrane with a clamped edge has the disadvantages of being very stiff and being sensitive to membrane layer stress. More design flexibility can be obtained using a spring supported membrane with perforation slits in the membrane layer defining the springs, but additional length in the slits contributes to reduced acoustic leak resistance and higher corner frequencies.

In view of the foregoing, it would be advantageous to incorporate new features into the MEMS structure to further restrict the acoustic leak path, allowing for both lower corner frequencies and smaller back volumes. It would be advantageous if these acoustic leak control features could be incorporated using known MEMS processes. It would be further advantageous if the leak control features could be easily adapted to provide increased or decreased acoustic leak resistance for particular applications.

SUMMARY

This disclosure relates to new design features implemented in a MEMS device to control acoustic leak resistance. Specifically, these features are implicated when more resistance is required than can be achieved using restrictive membrane perforations.

In accordance with one embodiment, a microelectromechanical system (MEMS) device includes a substrate with a back cavity etch, a membrane above the back cavity, a back plate above the membrane, and a sealed perimeter acoustic leak control rim surrounding the perimeter of the membrane such that acoustic leak flow is possible through the slit between the membrane and the perimeter rim but not around the edge of the perimeter rim.

In another embodiment, the acoustic leak resistance is controlled by reducing the gap between membrane and backplate using indentations in the backplate which laterally separate the perforations in the membrane from the back plate vent hole openings.

In another embodiment, the acoustic leak resistance is controlled by reducing the gap between membrane and backplate using indentations in the membrane towards the backplate which laterally separate the perforations in the membrane from the back plate vent hole openings.

In another embodiment, the acoustic leak resistance is controlled by introducing an additional layer in the MEMS process either above the membrane layer or below the membrane layer with a solid region which overlaps the membrane perforations to further increase the flow resistance through the membrane perforations.

A microelectromechanical system (MEMS) microphone in one embodiment includes a backplate, a back cavity aligned with the backplate, at least one post extending from the backplate toward the back cavity, a membrane positioned between the backplate and the back cavity and including an inner portion and an outer portion, a gap defined by a planar portion of the inner portion and the backplate, a spring arm defined in the outer portion and supported by the at least one post, a first leak path between the back cavity and the gap defined between the inner portion and the spring arm, a second leak path between the back cavity and the gap defined between the spring arm and the back cavity, and a first leak path constriction configured to restrict leakage through at least one of the first leak path and the second leak path.

In one or more embodiments, the first leak path constriction is positioned laterally outwardly of the outer portion.

In one or more embodiments, the first leak path constriction and the membrane are formed from a membrane layer.

In one or more embodiments, the first leak path constriction extends outwardly from a rim, the rim is sealed with a ring, and the ring is integrally formed with the backplate.

In one or more embodiments, the first leak path constriction includes a first protuberance extending toward the membrane portion from a backplate plane in which the backplate extends.

In one or more embodiments, the inner portion is spaced apart from the backplate by a first minimum distance, the membrane is spaced apart from the first protuberance by a second minimum distance, and the second minimum distance is shorter than the first minimum distance.

In one or more embodiments, a MEMS microphone includes a second leak path constriction, the second leak path constriction including a second protuberance extending toward the membrane portion from the plane in which the backplate extends.

In one or more embodiments, the membrane is spaced apart from the second protuberance by a third minimum distance, and the third minimum distance is shorter than the first minimum distance.

In one or more embodiments, the first protuberance defines a first generally circular perimeter in a protuberance plane parallel to the backplate plane, the first generally circular perimeter including at least one first break, the second protuberance defines a second generally circular perimeter in the protuberance plane, the second generally circular perimeter including at least one second break, and the at least one first break is offset from the at least one second break in the protuberance plane.

In one or more embodiments, a MEMS microphone includes a third leak path constriction, the third leak path constriction including a third protuberance extending generally toward the membrane and located outwardly of the at least one post.

In one or more embodiments, the first leak path constriction includes a protuberance extending from the membrane toward the backplate.

In one or more embodiments, the inner portion is spaced apart from the backplate by a first minimum distance, the backplate is spaced apart from the protuberance by a second minimum distance, and the second minimum distance is shorter than the first minimum distance.

In one or more embodiments, the first leak path extends through a slit defining an inner side of the spring arm, the first leak path constriction is aligned with the slit and overlaps a portion of the inner membrane, the inner portion is spaced apart from the backplate by a first minimum distance, the first leak path constriction is spaced apart from the membrane by a second minimum distance, and the second minimum distance is shorter than the first minimum distance.

In one or more embodiments, the first leak path constriction is located above the slit.

In one or more embodiments, the first leak path constriction is located beneath the slit.

In one or more embodiments, a method of forming a MEMS microphone includes forming a backplate, forming a back cavity so as to be aligned with the backplate, forming at least one post such that the at least one post extends from the backplate downwardly toward the back cavity, forming a membrane so as to be positioned between the backplate and the back cavity, the membrane including an inner portion and an outer portion, defining a gap with a planar portion of the inner portion and the backplate, defining a spring arm in the outer portion, the spring arm positioned to be supported by the at least one post, forming a first leak path between the back cavity and the first gap between the inner portion and the spring arm, forming a second leak path between the back cavity and the first gap between the spring arm and the back cavity, and forming a first leak path constriction so as to provide a desired acoustic leakage through at least one of the first leak path and the second leak path.

In one or more embodiments, forming the first leak path constriction includes forming a first protuberance extending toward the membrane portion from a backplate plane in which the backplate extends.

In one or more embodiments, at least a portion of forming the first protuberance is performed simultaneously with at least a portion of forming the backplate.

In one or more embodiments, a method of forming a MEMS microphone includes forming a second protuberance extending toward the membrane portion from the backplate plane.

In one or more embodiments, forming the first protuberance comprises forming the first protuberance with a first generally circular perimeter in a protuberance plane parallel to the backplate plane, the first generally circular perimeter including at least one first break, forming the second protuberance comprises forming the second protuberance with a second generally circular perimeter in the protuberance plane, the second generally circular perimeter including at least one second break, and the at least one first break is offset from the at least one second break in the protuberance plane.

BRIEF DESCRIPTION OF THE DRAWINGS

The accompanying drawings illustrate various embodiments of the present disclosure and together with a description serve to explain the principles of the disclosure.

Corresponding reference characters indicate corresponding parts throughout the several views. Like reference characters indicate like parts throughout the several views.

DETAIL DESCRIPTION OF THE DISCLOSURE

Figure 1:
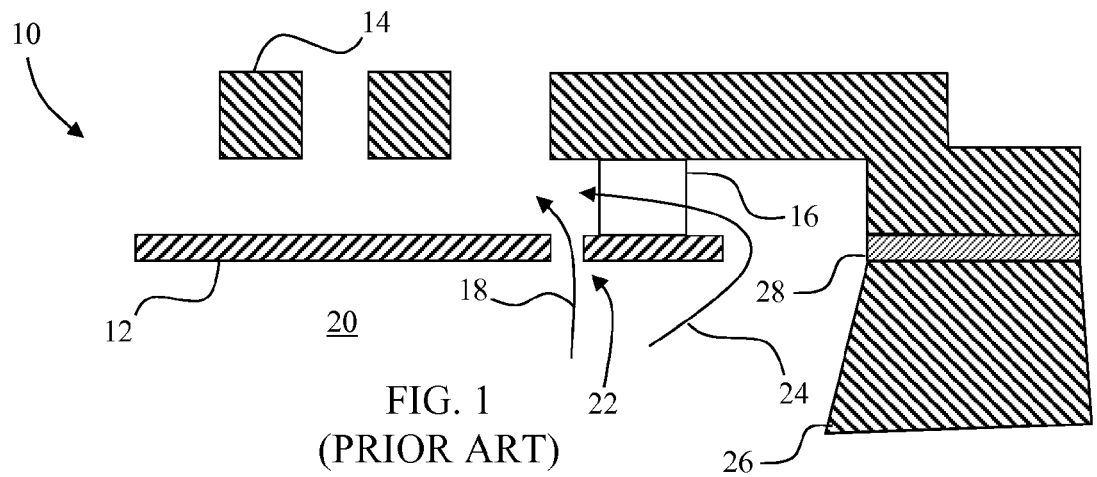
FIG. 1 depicts a partial cross-sectional view of a known MEMS device showing acoustic leak paths through membrane perforations and around the membrane perimeter.

While the systems and processes described herein are susceptible to various modifications and alternative forms, specific embodiments thereof have been shown by way of example in the drawings and will herein be described in detail. It should be understood, however, that there is no intent to limit the systems and processes to the particular forms disclosed. On the contrary, the disclosure is to cover all modifications, equivalents, and alternatives falling within the spirit and scope of the disclosure.

Figure 2A:
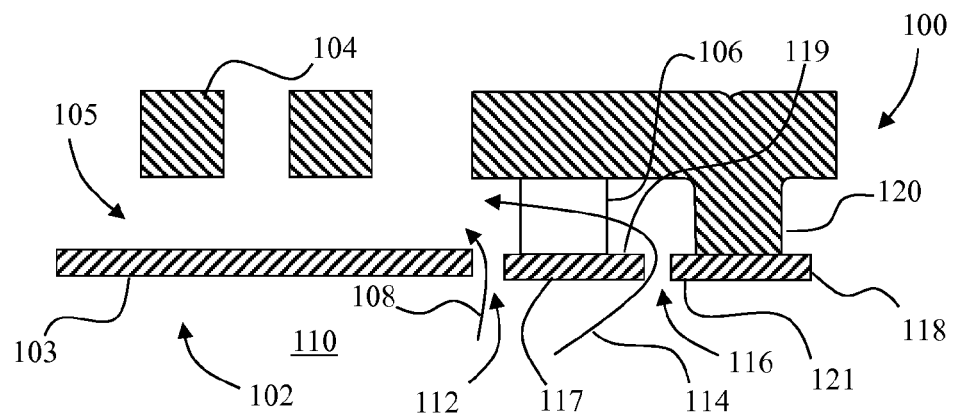
FIG. 2A depicts a partial cross-sectional view of a MEMS device with a perimeter acoustic leak control ring which is attached to the backplate.

FIG. 2A depicts a portion of a MEMS device 100 which in one embodiment is a microphone. The MEMS microphone 100 includes a membrane 102 which is supported from a backplate 104 by a series of posts 106. The membrane 102 includes an inner planar portion 103 which, with the backplate 104, defines a gap 105 wherein air separates the membrane and backplate. Acoustic leak path 108 is provided from a back cavity 110 through inner slit 112 to the gap 105.

A second acoustic leak path 114 is provided through outer gap 116 around the perimeter of the membrane 102. The inner slit 112 and outer gap 116 define a spring arm 117 at an outer portion 119 of the membrane 102. The perimeter of the membrane 102 is sealed by a rim 118 and a ring 120 of connecting material, which is also partially depicted in FIG. 2B. The seal formed by the rim 118 and the ring 120 of connecting material is substantially continuous, with some embodiments including a break (not shown), for example to allow an electrical trace to pass through to connect to the membrane. In an alternate embodiment, the second acoustic leak path 114 may be provided through a passageway formed in the rim 118 and the ring 120. The passageway may be formed during etchant process. In another embodiment, the acoustic leak path provided in the rim 118 and the ring 120 is a third leak path.

While not shown in FIGS. 2A or 2B, the MEMS device 100 typically includes a substrate, in some embodiments above the backplate and in other embodiments below the membrane, which support the device. Additionally, while only one post 106 is depicted, there will be a number of posts 106 positioned about the perimeter of the membrane in a typical application. Likewise, a number of inner slits 112 may be provided within the membrane 102.

Since the rim 118 is separated from the membrane 102 by the outer gap 116, the rim 118 is not connected to the membrane 102. The outer gap 116 thus restricts acoustic leakage around the perimeter of the membrane 102 without otherwise altering the function of the membrane 102. The gap 116 differs from a gap formed in the device 10 of FIG. 1 in that the rim 118 includes a constriction 121. A "constriction" as that word is used herein is a structure other than an in-plane portion of the membrane which affects one or more leak paths between a back-cavity and a gap between an inner planar portion and a backplate. As used herein, the word "lateral" is defined as a direction in which the plane defied by the inner portion of the membrane extends. Accordingly, a lateral extension of the membrane 102 outwardly of a support post as depicted in FIG. 2A is not a constriction. Likewise, the laterally outward extension of the membrane 12 beyond the post 16 in FIG. 1 is not a constriction structure.

Figure 2B:
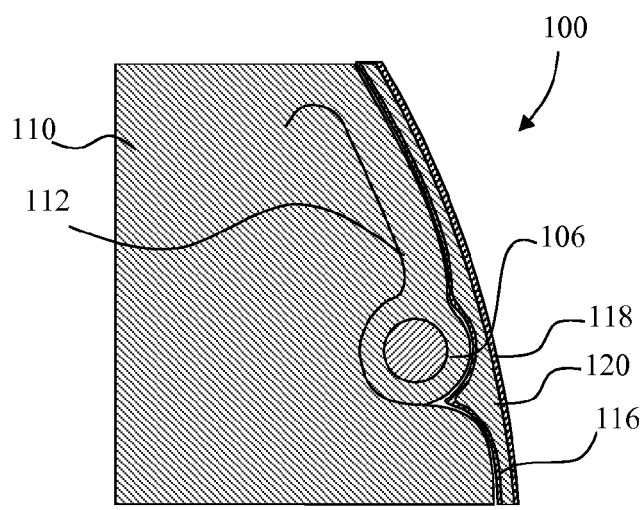
FIG. 2B depicts a top plan view of the perimeter acoustic leak control ring of FIG. 2A.

Thus, the acoustic leak paths in the device of FIGS. 2A and 2B exhibit reduced acoustic leak paths resulting in lower corner frequencies and allowing smaller back volumes compared to the device of FIG. 1. The inclusion of the perimeter rim 118, the gap 116, and the constriction 121 is accomplished using any desired MEMS processes including known processes. Moreover, by modifying the width of the gap 116 with the constriction 121, acoustic leak resistance of the device 100 is easily modified to accommodate a desired application without modification to the lateral extent of the membrane 102.

The perimeter rim 118 and constriction 121 in some embodiments is fabricated using the same material layer as the membrane 102. In other embodiments, an additional material layer is used to fabricate the rim 118 and/or constriction 121. Additionally, while the rim 118 is directly supported by the backplate 104 in the embodiment of FIGS. 2A and 2B, in some embodiments the rim 118 is directly supported by the substrate while in further embodiments both the backplate and a substrate support the perimeter rim 118.

Figure 3A:
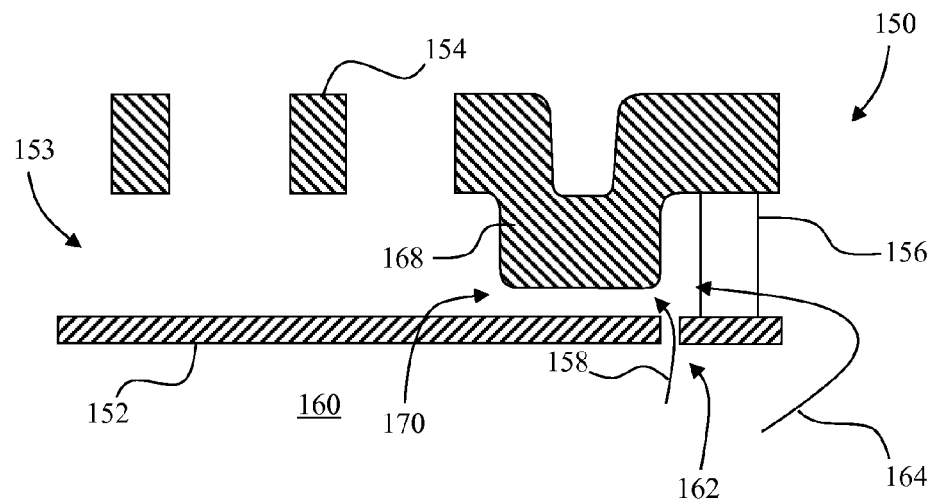
FIGS. 3A and 3B depict partial cross-sectional views of a MEMS device with single and multiple acoustic leak control indentations in the backplate.

FIG. 3A depicts a portion of a MEMS device 150 which in one embodiment is a microphone. The MEMS microphone 150 includes a membrane 152 which is supported from a backplate 154 by a series of posts 156. Acoustic leak path 158 is provided from a back cavity 160 through inner slits 162 to a gap 153 defined by the membrane 152 and the backplate 154. A second acoustic leak path 164 is provided outside of the perimeter of the membrane 152. The acoustic leak path 164 proceeds from outside of the membrane 152 (to the right in FIG. 3A) to the gap 153 (to the left as depicted in FIG. 3A).

The leakage from both the acoustic leak path 158 and the acoustic leak path 164 is governed by a protuberance 168 which creates a reduced gap 170 through which both the acoustic leak path 158 and the acoustic leak path 164 pass. The acoustic leak resistance is thus governed by both the width of the gap 170 (distance between the membrane 152 and the protuberance 168) and the length of the gap (distance along the gap from outside the protuberance 168 to inside the protuberance 168). The protuberance 168 is thus a constriction for both leak paths 158 and 164.

While not shown in FIG. 3A, the MEMS device 150 typically includes a substrate, in some embodiments above the backplate and in other embodiments below the membrane, which support the device. Additionally, while only one post 156 is depicted, there will be a number of posts 156 positioned about the perimeter of the membrane in a typical application.

The protuberance 168 is formed by "indenting" the backplate 154 to form the gap 170. In some embodiments, this is accomplished by forming a trench in a sacrificial layer, and forming the backplate layer on the sacrificial layer and within the trench. In some embodiments, etch release holes are formed immediately adjacent to the final location of the gap 170 to assist in forming the gap 170 by the removal of a gap spacing oxide. The etch holes are sufficiently small that they do not significantly reduce the acoustic leak resistance. The etch release holes in some embodiments are formed through the membrane layer while in other embodiments they are formed through the backplate layer. In some embodiments, the indentation or protuberance 168 is continuous around the membrane while in other embodiments wherein increased rigidity is desired the protuberance 168 is segmented.

Figure 3B:
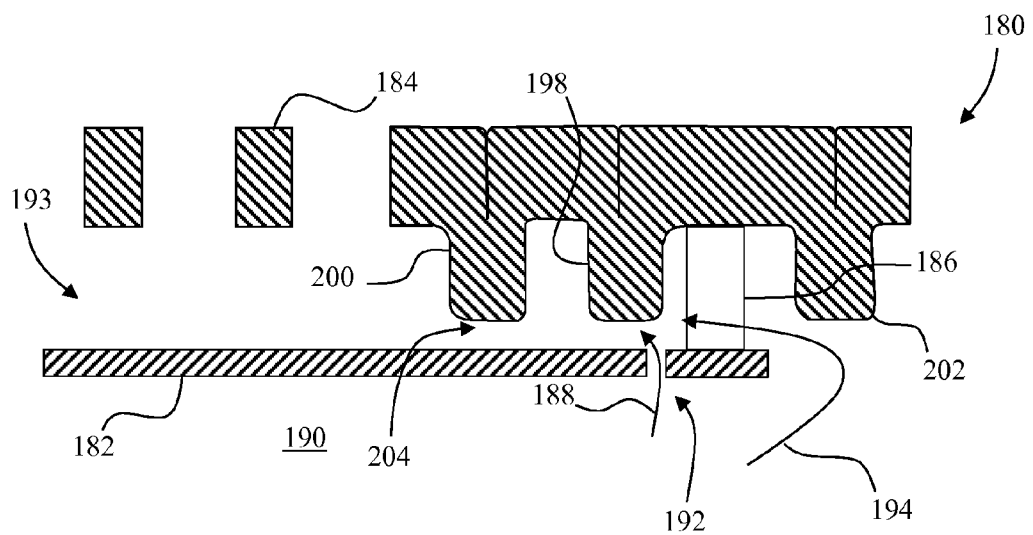

As noted above, the final acoustic leak resistance is a function of the length of the gap 170. In some embodiments, increased resistance is effected by forming a plurality of protuberances. By way of example, FIG. 3B depicts a portion of a MEMS device 180 which in one embodiment is a microphone. The MEMS microphone 180 includes a membrane 182 which is supported from a backplate 184 by a series of posts 186. Acoustic leak path 188 is provided from a back cavity 190 through inner slits 192. to a gap 193 defined by the membrane 182 and the backplate 184. A second acoustic leak path 194 is provided outside of the perimeter of the membrane 182. The acoustic leak path 194 proceeds from outside of a protuberance 198 (to the right in FIG. 3B) to inside (to the left as depicted in FIG. 3B) of a protuberance 200.

While only two constrictions in the form of indentations 198/200 are depicted, additional constrictions may be included in a series to obtain the desired acoustic leak flow resistance, and if the indentations are narrower than the twice the thickness of the backplate they may be completely filled with backplate material as shown in FIG. 3B. The protuberances 198 and 200 form a gap 204 which provides acoustic leak resistance which is a function of the combined characteristics of the protuberances 198, 200. In some embodiments wherein the protuberances 198, 200 are not formed as continuous rings, breaks in the protuberances 198 and 200 are offset from one another about the perimeter of the membrane 182.

FIG. 3B further depicts a constriction in the form of a protuberance 202 which is included in some embodiments. The protuberance 202 provides a function similar to that of the rim and ring of FIGS. 2A and 2B. Specifically, the protuberance 202 is located between the backplate vent hole opening and the membrane spring perforations thereby providing additional constriction around the perimeter of the membrane by surrounding the membrane or by completely or partially overlapping the perimeter of the membrane without connecting the membrane to the backplate.

In normal operation, the membrane 182 does not rest on or contact the protuberances 198, 200 or 202. It is possible, therefore, for stiction issues to arise in some embodiments. Because of the scale of the protuberances 198, 200 and 202, the protuberances 198, 200 and 202 do not provide anti-stiction functions. Accordingly, some embodiments further include anti-stiction bumps on the protuberances 198, 200 or 202. While anti-stiction bumps provide some resistance to air flow, the scale is such that any effect is de minimis. Accordingly, anti-stiction structures are excluded from the definition of a "constriction" as that term is used herein.

Figure 4:
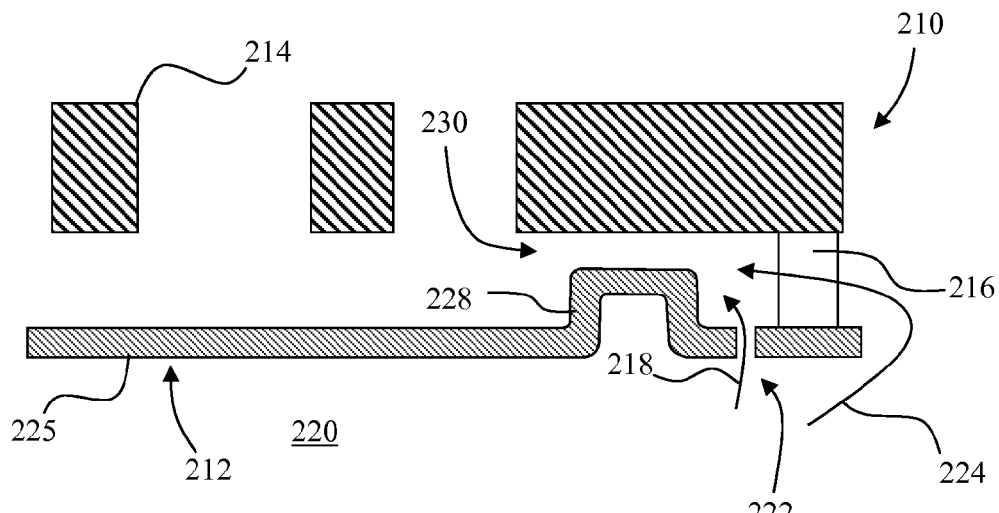
FIG. 4 depicts a partial cross-sectional view of a MEMS device with an acoustic leak control indentation in the membrane.

While constrictions are depicted in some of the foregoing embodiments which are connected to, or integrally formed with, the backplate, constrictions may also be supported directly by, or formed integrally with, a membrane. By way of example, FIG. 4 depicts a portion of a MEMS device 210 which in one embodiment is a microphone. The MEMS microphone 210 includes a membrane 212 which is supported from a backplate 214 by a series of posts 216. Acoustic leak path 218 is provided from a back cavity 220 through inner slits 222 to a gap 223 defined by an inner planar portion 225 of the membrane 212 and the backplate 214. A second acoustic leak path 224 is provided outside of the perimeter of the membrane 212. The acoustic leak path 224 proceeds from outside of a protuberance 228 (to the right in FIG. 4) to inside (to the left as depicted in FIG. 4) of the protuberance 228. The protuberance 228 in this embodiment is formed from a continuous ring. In other embodiments, the protuberance is segmented. Moreover, while not shown in FIG. 4, in some embodiments an additional protuberance is formed outwardly of the protuberance 228. In some embodiments, the outwardly formed protuberance is formed integrally with the membrane layer, while in other embodiments it is formed integrally with the backplate layer.

While some known membranes may have features similar to the protuberance 228, known corrugations in membranes are provided so as to increase flexibility of the membrane at the outer perimeter of the membrane. Accordingly, the depth of the corrugation is controlled for the desired flexibility. In contrast, the protuberance of FIG. 4 is formed to modify acoustic leakage. Accordingly, it is the gap 230, including both the width and the length of the gap 230, which is configured to provide the desired acoustic leakage characteristics using a constriction in the form of the protuberance 228.

Accordingly, the slit 222 is used in some embodiments to provide a spring support to the membrane 212 while the gap 230 is used to control the acoustic leakage by placing the protuberance 228 between the slit 222 and the primary openings in the backplate.

Figure 5A:
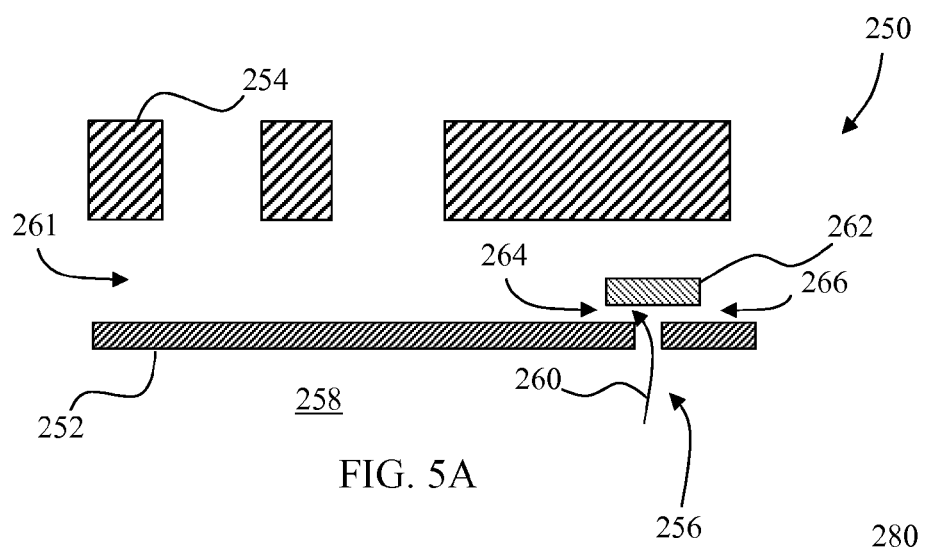
FIG. 5A depicts a partial cross-sectional view of a MEMS device with an additional acoustic leak control layer inserted between the membrane and backplate which covers membrane perforations.

The embodiments described above include formation of gaps for acoustic leakage control using constrictions associated with the backplate and the membrane layer. Acoustic leakage control gaps can also be formed using layers additional to the backplate and membrane layers. By way of example, FIG. 5A depicts a portion of a MEMS device 250 which includes a membrane 252, a backplate 254, and a slit 256 which allows acoustic leakage from a back cavity 258 through an acoustic leak path 260 to a gap 261 defined by the planar membrane 252 an the backplate 254. In this embodiment, an additional layer is used to form remnant 262 which forms gaps 264 and 266. The gaps 264 and 266 determine the acoustic leak characteristics of the device.

The remnant 262 is thus a constriction as it overlaps the slit 256 to create the gaps 264 and 266. In different embodiments the remnant 262 is supported by the membrane, by the backplate, or by the MEMS substrate, either directly or using additional connecting layers.

Figure 5B:
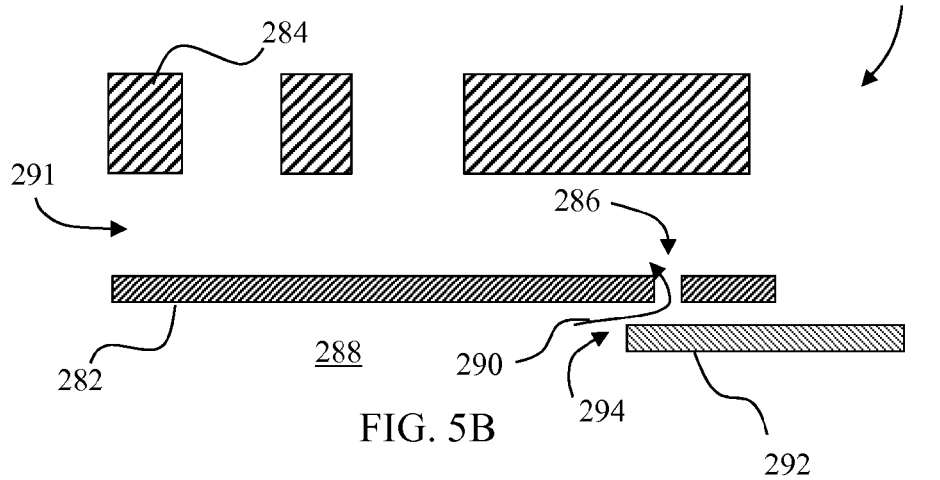
FIG. 5B depicts a partial cross-sectional view of a MEMS device with an additional acoustic leak control layer which covers membrane perforations and is inserted adjacent to the membrane on the membrane face opposite the backplate.

FIG. 5B depicts a portion of a MEMS device 280 which includes a membrane 282, a backplate 284, and a slit 286 which allows acoustic leakage from a back cavity 288 through an acoustic leak path 290 to a gap 291 defined by a planar portion of the membrane 282 and the backplate 284. In this embodiment, an additional layer is used to form remnant 292 which forms a gap 294. The gap 294 determines the acoustic leak characteristics of the device.

The remnant 292 is thus a constriction which overlaps the slit 286 to create the gap 294. Additionally, the remnant 292 is positioned within the spring legs of the membrane 282, thus providing the additional function of an overtravel stop in the out-of-plane direction. The width and the depth of the gap 294, however, are designed and configured for the desired acoustic leak characteristics. Accordingly, if the length of the gap is selected to provide a desired overtravel stop function, the width of the gap must be modified accordingly to provide the desired acoustic leakage characteristics.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

The invention claimed is:

1. A microelectromechanical system (MEMS) microphone comprising:
   a backplate;
   a back cavity aligned with the backplate;
   at least one post extending from the backplate toward the back cavity;
   a membrane positioned between the backplate and the back cavity and including an inner portion and an outer portion;
   a gap defined by a planar portion of the inner portion and the backplate;
   a spring arm defined in the outer portion and supported by the at least one post;

a first leak path between the back cavity and the gap defined between the inner portion and the spring arm;
a second leak path between the back cavity and the gap defined between the spring arm and the back cavity; and
a first leak path constriction configured to restrict leakage through at least one of the first leak path and the second leak path.

2. The MEMS microphone of claim 1, wherein the first leak path constriction is positioned laterally outwardly of the outer portion.

3. The MEMS microphone of claim 2, wherein the first leak path constriction and the membrane are formed from a membrane layer.

4. The MEMS microphone of claim 2, wherein:
the first leak path constriction extends outwardly from a rim;
the rim is sealed with a ring; and
the ring is integrally formed with the backplate.

5. The MEMS microphone of claim 1, wherein the first leak path constriction comprises:
a first protuberance extending toward the membrane portion from a backplate plane in which the backplate extends.

6. The MEMS microphone of claim 5, wherein:
the inner portion is spaced apart from the backplate by a first minimum distance;
the membrane is spaced apart from the first protuberance by a second minimum distance; and
the second minimum distance is shorter than the first minimum distance.

7. The MEMS microphone of claim 5, further comprising:
a second leak path constriction, the second leak path constriction including a second protuberance extending toward the membrane portion from the plane in which the backplate extends.

8. The MEMS microphone of claim 7, wherein:
the membrane is spaced apart from the second protuberance by a third minimum distance; and
the third minimum distance is shorter than the first minimum distance.

9. The MEMS microphone of claim 7, wherein:
the first protuberance defines a first generally circular perimeter in a protuberance plane parallel to the backplate plane, the first generally circular perimeter including at least one first break;
the second protuberance defines a second generally circular perimeter in the protuberance plane, the second generally circular perimeter including at least one second break; and
the at least one first break is offset from the at least one second break in the protuberance plane.

10. The MEMS microphone of claim 8, further comprising:
a third leak path constriction, the third leak path constriction including a third protuberance extending generally toward the membrane and located outwardly of the at least one post.

11. The MEMS microphone of claim 1, wherein the first leak path constriction comprises:
a protuberance extending from the membrane toward the backplate.

12. The MEMS microphone of claim 11, wherein:
the inner portion is spaced apart from the backplate by a first minimum distance;
the backplate is spaced apart from the protuberance by a second minimum distance; and
the second minimum distance is shorter than the first minimum distance.

13. The MEMS microphone of claim 1, wherein:
the first leak path extends through a slit defining an inner side of the spring arm;
the first leak path constriction is aligned with the slit and overlaps a portion of the inner membrane;
the inner portion is spaced apart from the backplate by a first minimum distance;
the first leak path constriction is spaced apart from the membrane by a second minimum distance; and
the second minimum distance is shorter than the first minimum distance.

14. The MEMS microphone of claim 13, wherein:
the first leak path constriction is located above the slit.

15. The MEMS microphone of claim 13, wherein:
the first leak path constriction is located beneath the slit.

16. A method of forming a microelectromechanical system (MEMS) microphone comprising:
forming a backplate;
forming a back cavity so as to be aligned with the backplate;
forming at least one post such that the at least one post extends from the backplate downwardly toward the back cavity;
forming a membrane so as to be positioned between the backplate and the back cavity, the membrane including an inner portion and an outer portion;
defining a gap with a planar portion of the inner portion and the backplate;
defining a spring arm in the outer portion, the spring arm positioned to be supported by the at least one post;
forming a first leak path between the back cavity and the first gap between the inner portion and the spring arm;
forming a second leak path between the back cavity and the first gap between the spring arm and the back cavity; and
forming a first leak path constriction so as to provide a desired acoustic leakage through at least one of the first leak path and the second leak path.

17. The method of claim 16, wherein forming the first leak path constriction comprises:
forming a first protuberance extending toward the membrane portion from a backplate plane in which the backplate extends.

18. The method of claim 17, wherein:
at least a portion of forming the first protuberance is performed simultaneously with at least a portion of forming the backplate.

19. The method of claim 18, further comprising:
forming a second protuberance extending toward the membrane portion from the backplate plane.

20. The method of claim 19, wherein:
forming the first protuberance comprises forming the first protuberance with a first generally circular perimeter in a protuberance plane parallel to the backplate plane, the first generally circular perimeter including at least one first break;
forming the second protuberance comprises forming the second protuberance with a second generally circular perimeter in the protuberance plane, the second generally circular perimeter including at least one second break; and
the at least one first break is offset from the at least one second break in the protuberance plane.

* * * * *